United States Patent [19]

Kinney et al.

[11] Patent Number: 5,422,724
[45] Date of Patent: Jun. 6, 1995

[54] MULTIPLE-SCAN METHOD FOR WAFER PARTICLE ANALYSIS

[75] Inventors: Patrick D. Kinney, Coon Rapids, Minn.; Yuri S. Uritsky, Foster City; Harry Q. Lee, Mountain View, both of Calif.

[73] Assignee: Applied Materials, Inc., Santa Clara, Calif.

[21] Appl. No.: 116,232

[22] Filed: Aug. 31, 1993

Related U.S. Application Data

[63] Continuation-in-part of Ser. No. 886,541, May 20, 1992, Pat. No. 5,267,017.

[51] Int. Cl.6 ............................................. G01B 11/00
[52] U.S. Cl. ..................................... 356/375; 356/72; 356/237
[58] Field of Search ................... 356/72, 73, 372, 375, 356/237

[56] References Cited

U.S. PATENT DOCUMENTS 4,659,220  4/1987  Bronte et al. ................. 356/237

Primary Examiner—F. L. Evans
Attorney, Agent, or Firm—Noel F. Heal; Peter J. Sgarbossa

[57] ABSTRACT

A method for reducing targeting errors encountered when trying to locate contaminant particles in a high-magnification imaging device, based on estimates of the particle positions obtained from a scanning device. The method of the invention includes scanning a semiconductor wafer in a scanning device, then preferably moving the wafer to a different orientation, and scanning the wafer again, to obtain at least two sets of particle coordinates that may differ slightly because of uncertainties in the scanning process. The multiple sets of coordinates are averaged to reduce the targeting errors, but only after transforming the coordinates to a common coordinate system. The transformation step includes computing transformation parameters for each possible pair of particles detected in at least two scans, averaging the results, and then transforming all of the particle coordinates to the common coordinate system. Optionally, the method may include discarding any transformation parameters that deviate too far from the average, and then computing the average transformation parameters again.

11 Claims, 5 Drawing Sheets

MULTIPLE-SCAN METHOD FOR WAFER PARTICLE ANALYSIS

CROSS-REFERENCE TO PRIOR APPLICATION

This is a continuation-in-part of application Ser. No. 07/886,541, filed on May 20, 1992, now U.S. Pat. No. 5,267,017, by Yuri Uritsky et al., and entitled "Method of Particle Analysis on a Mirror Wafer."

BACKGROUND OF THE INVENTION

This invention relates generally to techniques for the identification and analysis of contaminant particles on semiconductor wafers and, more particularly, to techniques for locating particles more reliably when using a high-magnification imaging device, such as a scanning electron microscope. Semiconductor fabrication technology today deals with wafer sizes up to 200 mm (millimeters) and feature geometries with dimensions well below 1 $\mu$m (micrometer). The presence of a particle larger than about a tenth the width of a conductive line on a wafer can lead to failure of a semiconductor chip made from the wafer. Therefore, a critical task facing semiconductor process engineers is to identify and, as far as possible, to eliminate sources of surface contamination.

A well known approach to identification and analysis of contaminant particles involves the use of a scanning electron microscope (SEM) to locate particles on an unpatterned semiconductor wafer, referred to as a mirror wafer. Scanning X-ray spectroscopy or optical microscopy systems may also be used for this purpose. Because critical particles sizes may be as small as 0.1–0.2 $\mu$m, the SEM must use a magnification of approximately 2000× to allow the smallest critical particles to be seen by the human eye, which has a resolution limitation of approximately 0.2 mm. At this high level of magnification, it is extremely difficult to find a particle on the wafer unless its position is known quite accurately before the SEM or similar system is used.

Because the SEM must be operated only at high levels of magnification, it is not a useful instrument to obtain an overview of particles on an entire wafer. Other devices have been developed for this purpose and a two-stage process for locating and analyzing particles is normally employed. In the first stage, the wafer is raster-scanned with a laser beam to locate practically all of the particles on the wafer or in an area of interest on the wafer. The manner in which the laser beam is scattered from the particles yields signals from which the approximate sizes and locations of the particles can be deduced, for output to a computer display screen. However, because the scattering mechanism is not completely understood, the signals are of little help in identifying the type, chemical composition, and possible source of contaminant particles. This information can only be obtained with the help of a high-magnification imaging device, such as an SEM.

As already mentioned, locating a particle using an SEM can be extremely difficult or impossible unless the position of the particle is first known to some degree of accuracy. Specifically, at a magnification of 2000× a 0.1 $\mu$m particle must be "targeted" to an accuracy of about 40 $\mu$m in order to be located on the SEM viewing screen. Basically, the laser scanning technique provides estimated particle positions, in terms of x and y coordinates. To locate a particle of interest with the SEM, the estimated coordinates for that particle are fed into the SEM, which, at high magnification, provides a view of only a very small part of the wafer. The targeting error is the distance between the estimated position of the particle and its actual position when viewed on the SEM viewing screen. If the targeting error is greater than about 40 $\mu$m, the particle will not even appear on the viewing screen and an extended search of the viewing screen may be required. In some cases, the particle may never be located in the SEM.

A critical aspect of this two-stage particle analysis method is that the coordinate system used in the laser scanning device must be transformed to the coordinate system used in the SEM or other similar device. In most systems, the wafer has to be physically moved from one device to the other and, in any event, the coordinate systems used in the laser scanning device and the SEM will be totally different. When a wafer is first placed in the SEM, the wafer edges and a reference feature (a notch or a flat segment in the edge) are detected by the SEM and used to provide a first approximation for transformation of the coordinates from the scanning device to the SEM. An improved transformation is then obtained by identifying, in both devices, two reference particles that are relatively recognizable, because of their size and contrast. Given the coordinates of these two reference particles, as measured in the coordinate systems of both devices, a simple and well known coordinate transformation can be used to transform the other particle locations from one coordinate system to the other. Each particle may then be more easily located in the SEM and further analyzed to determine its characteristics and possible source.

The two-stage particle location and analysis technique briefly described above has been used with some measure of success, but still has at least one significant disadvantage. It has been found that the accuracy with which the particles can be located depends in part on the positions of the particles selected as reference particles. Specifically, the targeting error may vary between 50$\mu$m and 300$\mu$m, depending on particle position on the wafer. As a result of this, nearly one-third of the particles may not be found using the SEM.

The cross-referenced application describes and claims several related techniques for improving the targeting accuracy in the two-stage process. One of these techniques involves subjecting the wafer to one or more additional scans during the first stage of processing, in the laser scanning device. At the time the cross-referenced application was filed, this double-scan method was not fully understood. Some scanning devices incorporate automatic averaging of particle coordinate data from two consecutive scans, but the averaged data do not provide improvement over a single scan. An improved multiple-scan method has subsequently been invented, yielding further improvement in targeting accuracy, and is described below.

SUMMARY OF THE INVENTION

The present invention resides in a method for reducing targeting errors encountered when trying to locate contaminant particles on a semiconductor wafer, using a high-magnification imaging device, and based on estimates of the particle positions obtained from a scanning device. The invention provides a substantial reduction in the targeting errors associated with particle coordinates derived from the scanning device. In the two-stage analysis technique, the scanning device generates estimated positions of all particles on the wafer, and the imaging device uses this positional data to locate the particles for further analysis. Success of the technique is very much dependent on the accuracy of the estimated particle positions generated in the scanning device. The present invention is a new approach for reducing targeting errors in the estimated positions.

Briefly, and in general terms, the method of the invention comprises the steps of (a) scanning a semiconductor wafer in a scanning device to produce a first set of data coordinate values pertaining to the positions and sizes of contaminant particles on the wafer; (b) scanning the wafer a second time, to produce a second set of data coordinate values pertaining to the particles on the wafer; (c) transforming at least one of the first and second sets of coordinate data values, to produce two consistent sets of coordinate data values based on a common coordinate system, whereby the first and second sets of coordinate data values will not, in general, be identical because of uncertainties associated with the scanning steps; and (d) averaging the two consistent sets of coordinate data values pertaining to corresponding particles, to obtain a more accurate estimate of the positions of the particles on the wafer. Preferably, the wafer is physically moved to a different orientation between the two scanning steps, but a significant improvement may also be obtained without such a movement.

The method may also include scanning the wafer at least one additional time, to produce a third set of data coordinate values, transforming the third set of data coordinate values to the common coordinate system, and averaging the third set of transformed data coordinate values with the first two sets. The resulting averages provide additional accuracy in the estimated positions of particles on the wafer.

More specifically the step of transforming (c) includes identifying matching particles from the first and second scans; computing a coordinate transformation data group for a plurality of pairs of matching particles identified from each scan; computing average coordinate transformation parameters from the data groups computed in the prior step; and transforming coordinate data for each particle in one of the scans to the coordinate system of the other scan, using the improved average coordinate transformation parameters. Thus the coordinate data from one scan are transformed to the coordinate system of the other scan, and the two sets of data can then be compared or otherwise manipulated. In the preferred embodiment of the invention, corresponding coordinate parameters from the two sets of data are averaged to arrive at an improved set of estimated particle positions.

Optionally, the method may also include the steps of identifying and removing data groups that depart from the average coordinate transformation parameters by more than a preselected threshold; and computing improved average coordinate transformation parameters with the identified data groups removed. The step of transforming the coordinate data then uses the improved average coordinate transformation parameters.

The invention may also be considered to include additional steps relating to how the scan data parameters are used in conjunction with the imaging device. Therefore, the invention may include the additional steps of selecting at least two reference particles that are relatively recognizable because of their size and contrast; obtaining estimated coordinates of the reference particles from the scanning device; moving the semiconductor wafer to a high-magnification imaging device and performing an approximate coordinate transformation for the reference particles; finding the reference particles in the imaging device and obtaining their corresponding actual coordinates in the imaging device; calculating the parameters for a more accurate coordinate transformation between the coordinate systems of the scanning device and the imaging device, based on multiple unique pairs of the reference particles and their estimated coordinates and actual coordinates: and transforming the coordinates of other particles on the wafer from values obtained from the scanning device to estimated values in the coordinate system of the imaging device, to facilitate location and further analysis of the particles in the imaging device.

It will be appreciated from the foregoing that the present invention represents a significant advance over prior techniques for locating and analyzing contaminant particles on the surface of a semiconductor mirror wafer. Other aspects and advantages of the invention will become apparent from the following more detailed description, taken in conjunction with the accompanying drawings.

DESCRIPTION OF THE PREFERRED EMBODIMENT

Figure 1:
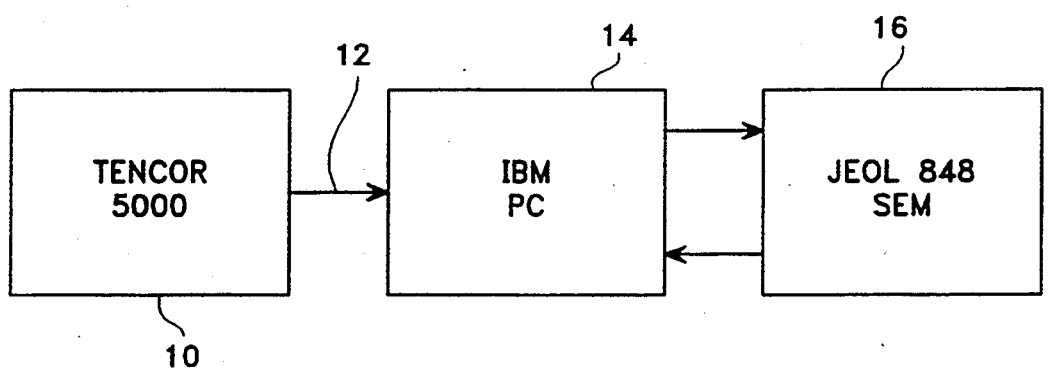
FIG. 1 is a block diagram showing a two-stage system of particle analysis.

As shown in the drawings for purposes of illustration, the present invention is concerned with an improved technique for locating contaminant particles on a semiconductor mirror wafer. Basically, the invention provides significantly reduced targeting error values. That is to say, the method of the invention allows the prediction of particle positions more accurately, and therefore allows more particles to be located when using an imaging device, such as a scanning electron microscope (SEM).

As mentioned above, semiconductor feature sizes below the 1 μm level and large wafer sizes have made it extremely difficult to locate and identify all of the contaminant particles on a mirror wafer. A two-stage technique has been developed, first using a laser scanning device to map practically the entire wafer and to provide an estimate of the locations and sizes of particles on the wafer surface. Then the wafer is moved to a scanning electron microscope (SEM) or similar device, and as many particles as possible are located and further analyzed. The coordinates of each particle are transformed from the coordinate system of the laser scanning device to the coordinate system of the SEM. A first approximation for the transformation is obtained using SEM detection of the wafer edges and orientation features (notch or flat edge segment). Then the coordinate transformation is improved by using two reference particles that can be readily identified in both devices because of their size and contrast. Because of the high magnification factor that must be used in the SEM, the estimated particle positions obtained from the laser scanning device must be very accurate, or it will be difficult or impossible to locate the particles using the SEM. The principal difficulty with this approach has been that the average targeting error of "run" particles, i.e. particles other than the selected reference particles, is typically in the range 100–150 μm, but a targeting error of approximately 40 μm or less is needed to reliably locate a 0.1 μm particle using a magnification of 2000×. If the targeting error is greater than this, the particle will be outside the field of an SEM viewing screen and may require a time-consuming search to locate with the SEM, or even be impossible to find. On the other hand, if the accuracy of the laser scanning stage can be improved, this will greatly facilitate the analysis performed in the SEM stage.

The present invention is based on the principle that the multiple scans in the laser scanning stage, even without movement of the wafer in the scanning device, may produce slightly different coordinate data for the same particle. Therefore, averaging or otherwise combining the results of the multiple scans will not always yield improved results. Random physical uncertainties, which cause these different results, arise from inaccuracies in the position of a lead screw used to translate the wafer with respect to the scanning beam, or inaccuracies in the scanning mechanism, combined with the effect of a significant beam thickness. The scanning device attempts to compensate for differences in wafer orientation for separate scans, by transforming all data to a standard wafer orientation, but this transformation does not take into account the various random uncertainties that cause differences in the results of two scans, even in the same wafer orientation. The present invention performs an additional coordinate transformation for one of the two scans, to render the data of the two scans consistent, so that they may be averaged to obtain more accurate results.

So that the invention can be better understood, the principles of operation of the laser scanning system will be described in some detail. In the first processing stage, a wafer is introduced into a laser scanning device, such as a Tencor SurfScan (SFS) model SFS4000, SFS5000, or SFS6000, manufactured by Tencor Instruments, which scans the surface of the wafer in a raster fashion and produces signals from which a display of the particles on the wafer is generated. As shown in FIG. 1, the scanning device, indicated at 10, produces outputs on line 12 to a personal computer 14. When the wafer is scanned by a scanning electron microscope (SEM) 16, the wafer edges and orientation-dependent features (notch or flat edge segment) are located and used to provide an approximate coordinate transformation between the scanning device 10 and the SEM 16. This approximate transformation is improved by locating selected reference particles both in the laser scanning system and in the SEM 16, which passes reference particle position information back to the personal computer 14. The computer then computes an improved coordinate transformation based on the positions of the selected reference particles. Using the coordinate transformation based on the positions of multiple reference particles in both the laser scanning device and the scanning electron microscope, the positions of other particles generated by the laser scanning device can be transformed to the SEM system, which is then used for physical analysis of the particles.

Figure 2A:
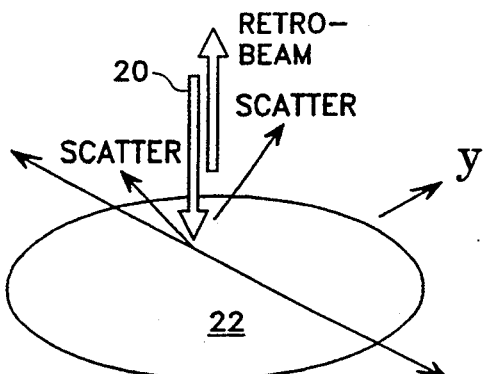
FIG. 2a is a diagram showing the directions of laser beam scanning and wafer transport.

As shown in FIG. 2a, in the laser scanning device 10 a laser beam 20 is swept across the surface of a wafer 22, and scattered light signals from particles and defects on the wafer surface are collected and used to deduce the coordinates of the defects. The sweep direction of the laser beam 10 is in the x-axis direction and the average speed of the beam at the wafer surface is on the order of 300–400 m/s. Motion in the y-axis direction is effected by means of a lead screw (not shown) which translates the entire wafer in a direction perpendicular to the direction of beam scanning. The net result, for the SFS5000, is a beam spot size of 133 μm in diameter tracing scan lines which are 33.3 μm apart.

Figure 2B:
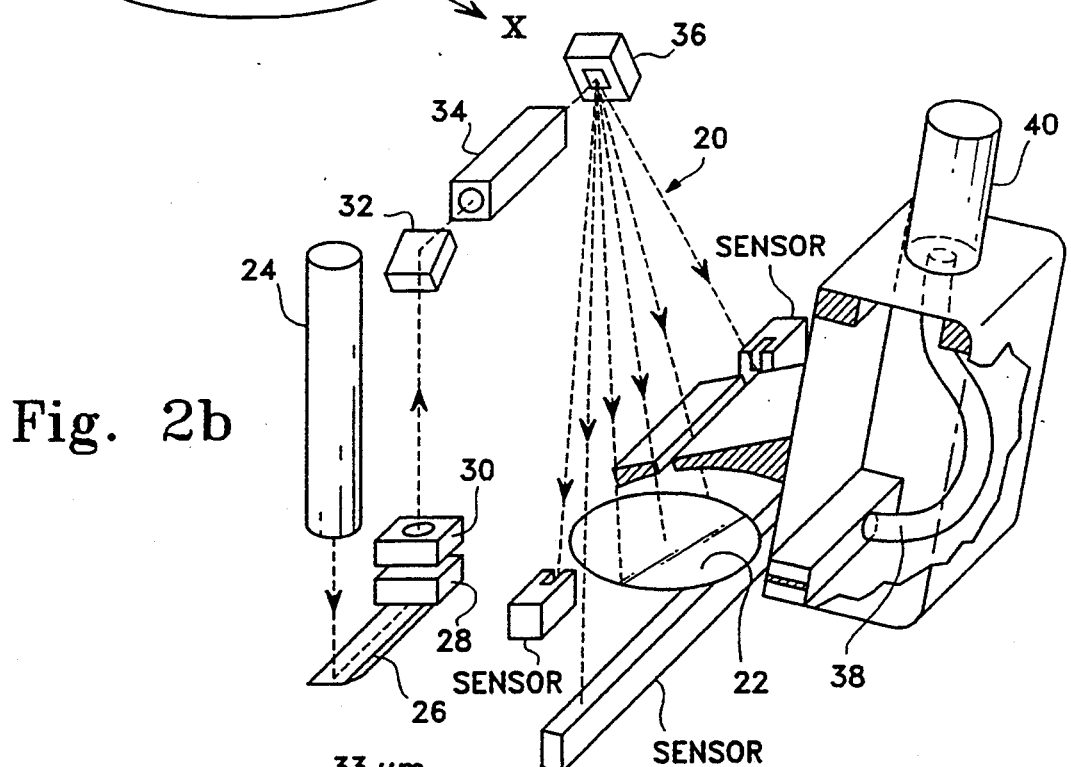
FIG. 2b is a perspective view of the principal components of a laser scanning system to locate particles on a semiconductor wafer.

When the laser spot illuminates a defect on the wafer surface, light is scattered away from the point of incidence. FIG. 2b shows the optical system in more detail, including a laser 24 and various optical elements, including a prism 26, a lens 28, a spatial filter 30, a mirror 32, another lens 34, and a scanning mirror 36, which sweeps the beam 20 across the wafer 22. An array of optical fibers 38 collects light scattered from the wafer 22. The fibers 38 are connected in a bundle to a low-noise photomultiplier tube (PMT) 40, which amplifies the optical signal and generates a corresponding electrical output. The output of the PMT 40 is digitized by an analog-to-digital converter (not shown). Then the particle positions are determined based upon the positions of the laser spot (x-axis position) and the lead screw (y-axis position) at the time of digitization.

Figure 2C:
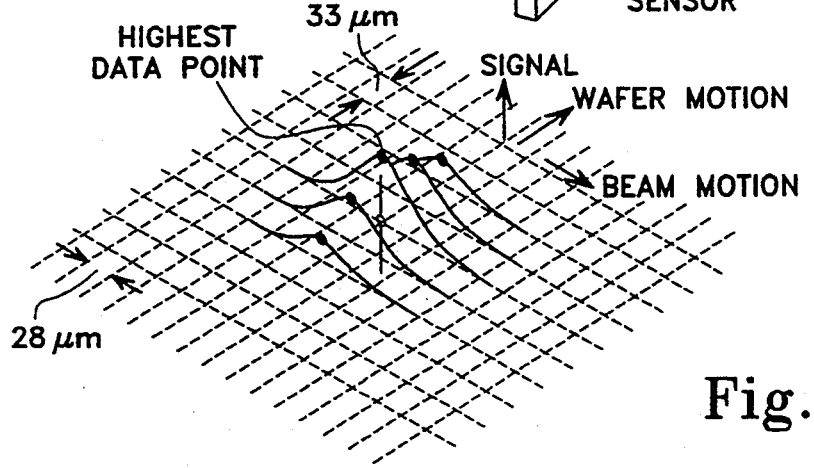
FIG. 2c is a graphical view plotting a back-scattered signal received from a wafer scanned in one type of laser scanning system.

The horizontal (x-axis) position is determined by sampling the scattering signal, either at uniform spatial intervals as the laser beam scans the wafer surface, as in the SFS6000, or at uniform time intervals. Spatial, rather than time, intervals are preferred in the sampling because the laser spot moves along the wafer plane with a sinusoidal velocity profile. Time interval sampling under this non-linear velocity profile would produce non-equally spaced points in the spatial array. FIG. 2c is a three-dimensional representation of scattered light signals received from an area of the sample grid near a particle on the wafer. The sample grid, which is specific to the SFS5000 scanning system, has horizontal (x-axis) scans located 33.3 μm apart, and the separation of the discrete samples is 28 μm. The sample point associated with the largest scattering signal is assumed to be the physical location of the particle.

Figure 3A:
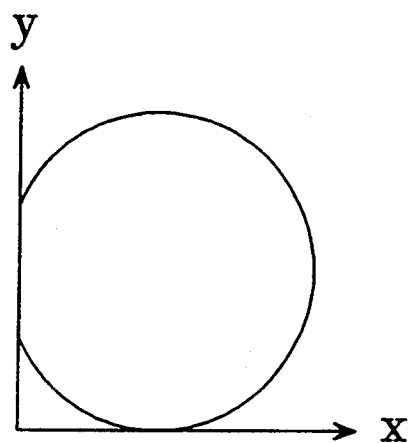
FIG. 3a shows the coordinate axes established by the scanning device for conventional six-inch wafers.
Figure 3B:
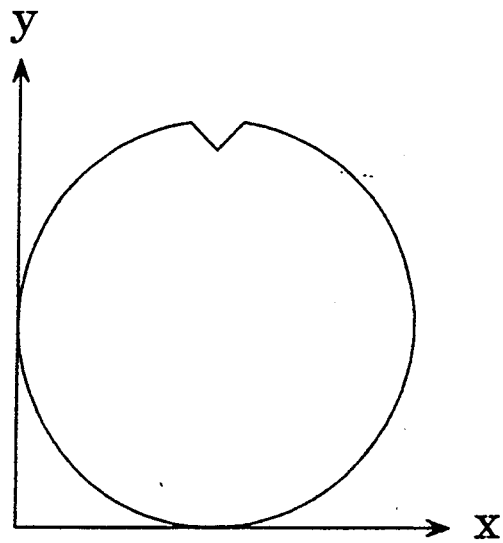
FIG. 3b shows the coordinate axes established by the scanning device for conventional eight-inch wafers.

After all particles are located in the laser scanning device, the device deduces the position of the edge of the wafer from previous scans. Then a coordinate system is automatically established from the position of the wafer edge. For six-inch wafers, which have a flat segment in their otherwise circular circumference, as shown in FIG. 3a, the flat of the wafer edge is assumed to be coincident with the y axis, and the x axis is tangent to the bottom of the wafer. For an eight-inch wafer, which has a notch in its otherwise circular circumference, the coordinate system is established such that the notch is at the "12 o'clock" position, as indicated in FIG. 3b; then the x and y axes are assumed to be tangent to the wafer edge. Once the wafer coordinate system is established, all particles located by the laser scanning device are referenced to this coordinate system. In other words the scanning device 10 automatically converts particle coordinate data to a standard frame of reference, either that of FIG. 3a or that of FIG. 3b. It would appear that data from separate scans of the same wafer, even in different orientations, could be averaged since the data have been transformed to the standard coordinate system. However, as mentioned above, random uncertainties in the scanning process result in differences in the coordinate data derived from two separate scans.

Several sources of uncertainty result from the fundamental operation of such a laser scanning system. The primary source of uncertainty arises from the discrete sampling grid approximation to particle locations. Because the size of the smallest sample cell (in the SFS5000 scanning system) is 28 μm×33 μm, the maximum error due solely to the discrete nature of the sampling process is 14 μm×16.5 μm. Uncertainties arising from the discrete nature of the sampling process will be referred to as "discretization" errors.

Figure 4:
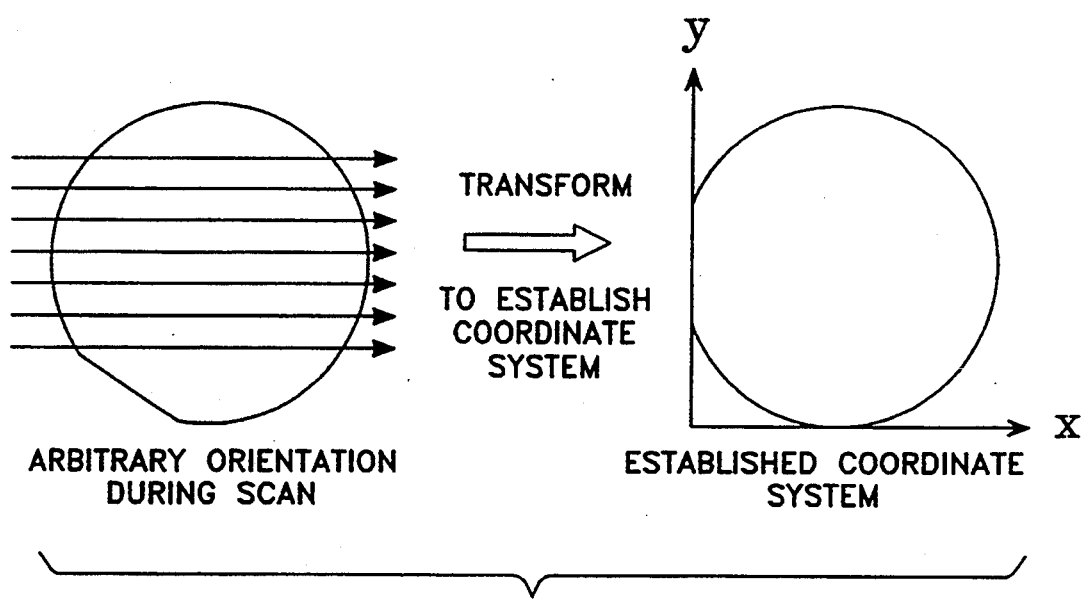
FIG. 4 is a diagram showing a wafer in an arbitrary orientation in relation to a laser scanning direction, and indicates that a coordinate transformation is needed, and is performed automatically in the scanning device, to convert the scanned data to an established or standard coordinate system.

An additional error arises from the construction of the coordinate system. Because the wafer may be arbitrarily oriented in the laser scanning device, the x-y positions obtained by the laser scan must be transformed to the established coordinate system as shown in FIG. 3. For example, FIG. 4 shows a six-inch wafer arbitrarily oriented during the scan, in comparison with the established coordinate system.

To make this transformation, the edge and flat segment of a six-inch wafer must be determined precisely. For an eight-inch wafer, the edge and notch must be located precisely. This is particularly difficult because the notch is only 1 mm×1 mm on a 200-mm diameter wafer. If the angular position of the notch were located in error by, say, 1°, the resulting error in particle positions would be 1,700 μm for particles near the wafer edge. Since the determination of the wafer edge, flat and notch are subject to the same "discretization" errors as the particles, errors in locating these wafer features may propagate to much larger errors after the particle coordinates are transformed using edge data to the established coordinate system.

Uncertainties also result from discretization errors due to non-uniform lead screw pitch, which cause the wafer speed to fluctuate as it passes under the beam. Uncertainties may also result from differences in wafer orientation during scanning.

The multiple-scan method of the invention reduces discretization errors, errors due to the determination of the wafer edge, and possible errors resulting from the interaction of the laser beam with a particular particle shape or morphology. The underlying principle of the invention is that each scan of the same wafer is unique, due to random uncertainties in the scanning process. Thus each scan produces slightly different x-y coordinates for the same particles, with the differences being due to various factors, such as physical inaccuracies in the scanning mechanism, and discretization effects. Since each scan is equally accurate, one may average two or more scans, i.e. perform a double scan or multiple scan, to yield improved values for the particle positions, but the coordinate data of the multiple scans must be transformed to a common coordinate system before averaging.

By way of example, a double scan process will be described in more detail, but it will be understood that the principles of the invention apply equally well to three, four or more scans. If a wafer is scanned with its flat or notch in a first position, then removed from the chamber, rotated, and returned to the chamber for a second scan, two sets of x-y coordinates for the detected particles are obtained. Experimental data shows that a wafer rotation of approximately 30–40 degrees produces the best improvement in accuracy of the method, but it will be understood that no rotation of the wafer is needed in order to practice the invention in its broadest form. A necessary processing step is to eliminate any differences between the coordinate systems associated with the two wafer scans. This may be accomplished by measuring the difference between the coordinate systems of the two scans and correcting the data from one of the scans. Basically, the data from one of the scans is corrected by performing a coordinate transformation, to transform the data to the coordinate system of the other scan. An additional step is to discard any data relating to extraneous particles which either cannot be matched between the two scans, or which do not contribute to the transformation parameters. Once the coordinate systems of the two scans match, corresponding particle coordinates are averaged to yield improved particle positions. Use of this technique has reduced the targeting error to an average of approximately 45–50 μm. Moreover, the number of particles with large errors (more than 100 μm) has been significantly reduced. A more detailed description of the steps followed in the double-scan method follows in the succeeding paragraphs.

Figures 5A, 5B:
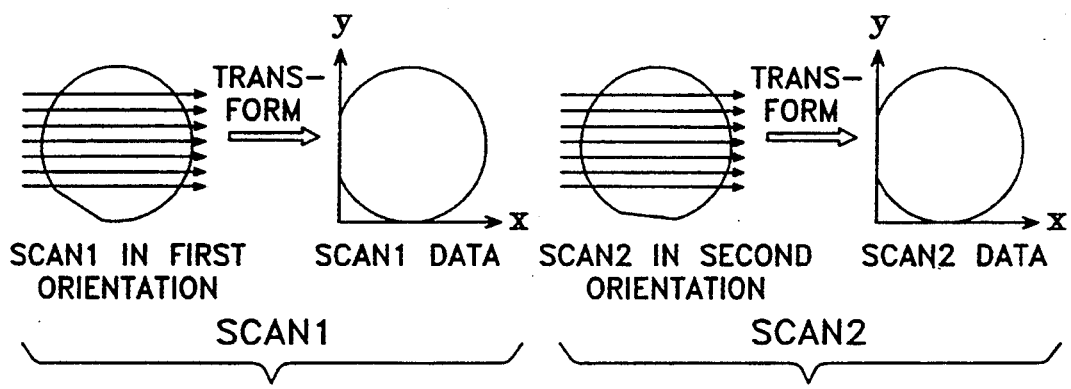
FIG. 5a is a diagram showing the transformation of data from a first scan to an established coordinate system, this transformation being performed automatically in the scanning device.
FIG. 5b is diagram similar to FIG. 5a, showing the transformation of data from a second scan, in which the wafer is oriented differently from the first scan, to the same established coordinate system.

1) Generate Data: The first step in the method is to generate data from at least two separate scans of the same wafer, which, as indicated in FIGS. 5a and 5b, is preferably oriented differently for the two scans. The wafer may be physically moved between two scans, or sufficient differences in results may be obtained by performing multiple additional scans without moving the wafer. The two scans are referred to as Scan1 and Scan2, respectively. As noted earlier, some improvement in accuracy may even be obtained if the two scans are consecutive and are made at the same wafer orientation. The x-y coordinate data for each of the multiple scans are automatically transformed, in the scanning device, to a standard coordinate system, using the flat segment (in a six-inch wafer) as a reference for the y axis. The two sets of data may now be compared, but may still not be identical because they were derived from different scans, subject to random differences in the scanning process.

Figure 6:
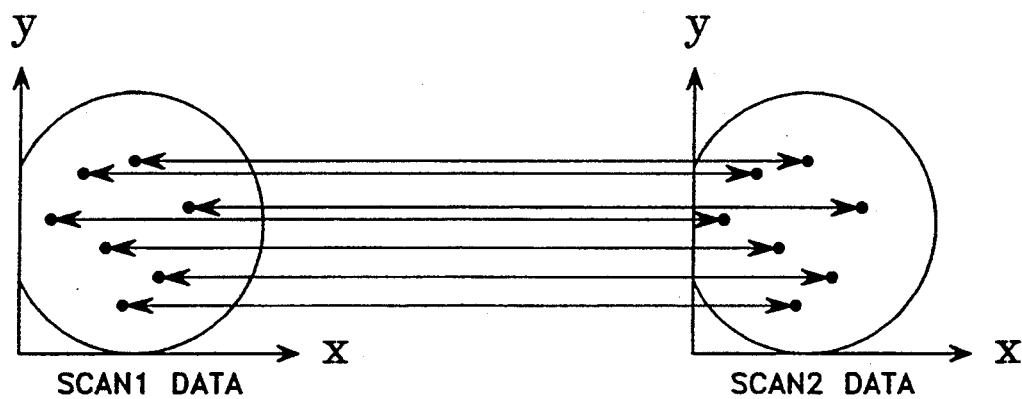
FIG. 6 is a diagram showing two sets of data, relating to seven matching particles scanned in each of two scans.

2) Match Identical Particles: Matching particles located in both scans are located, as indicated in FIG. 6. The criteria for particle matching are that x and y positions for a particle in one scan must be within a selected distance (e.g., +100 μm) of the positions as measured in the other scan, and the scattering areas of the detected particles must be approximately the same, to within a selected difference in area (e.g., ±0.3 μm²). The elimination of particles identified in one scan that do not have identifiable counterparts in the other scan, represents another advantage to the method of the invention. Sometimes as many as twenty percent of particles identified by the scanning device cannot be located in the SEM and may well be non-existent. The early elimination of such "particles" from consideration saves a significant amount of SEM operation time that would otherwise be spent looking for non-existent particles.

Figure 7:
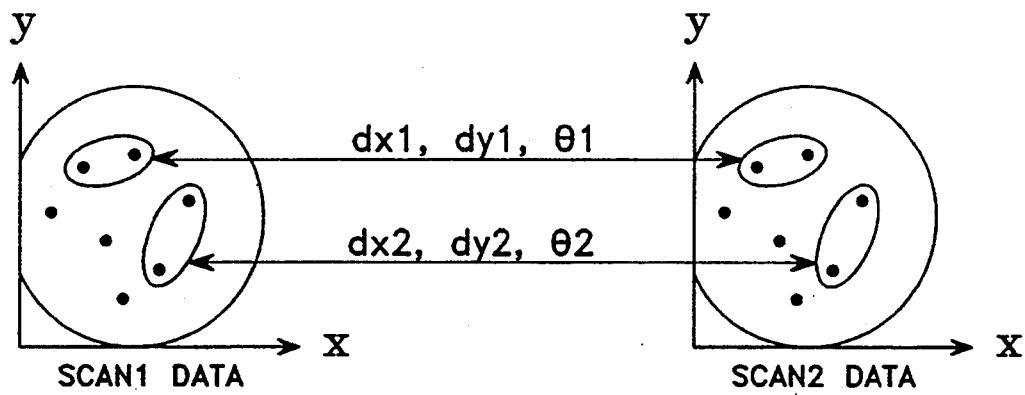
FIG. 7 is a diagram showing the computation of coordinate transformation parameters for pairs of particles scanned in each of two scans.

3) Compute Average Transformation: For each pair of matching particles, i.e. two particles from one scan and two matching particles from the other scan, coordinate transformation data are computed. The transformation of a pair from one scan to the other is expressed in the form of a linear displacement of the x and y axes and an angular rotation of the axes. As shown in FIG. 7, the transformation for a first pair of matching particles is expressed as $(dx_1, dy_1, \theta_1)$, and the transformation of a second pair of matching particles is expressed as $(dx_2, dy_2, \theta_2)$. In general the transformation $(dx_i, dy_i, \theta_i)$ is computed for every possible pair of matching particles, except that no transformation is computed unless the particles in a pair are more than a selected distance apart (e.g. 30 mm) in both x and y directions. This condition eliminates uncertainties in the transformation due to particles being too close together.

Figure 8:
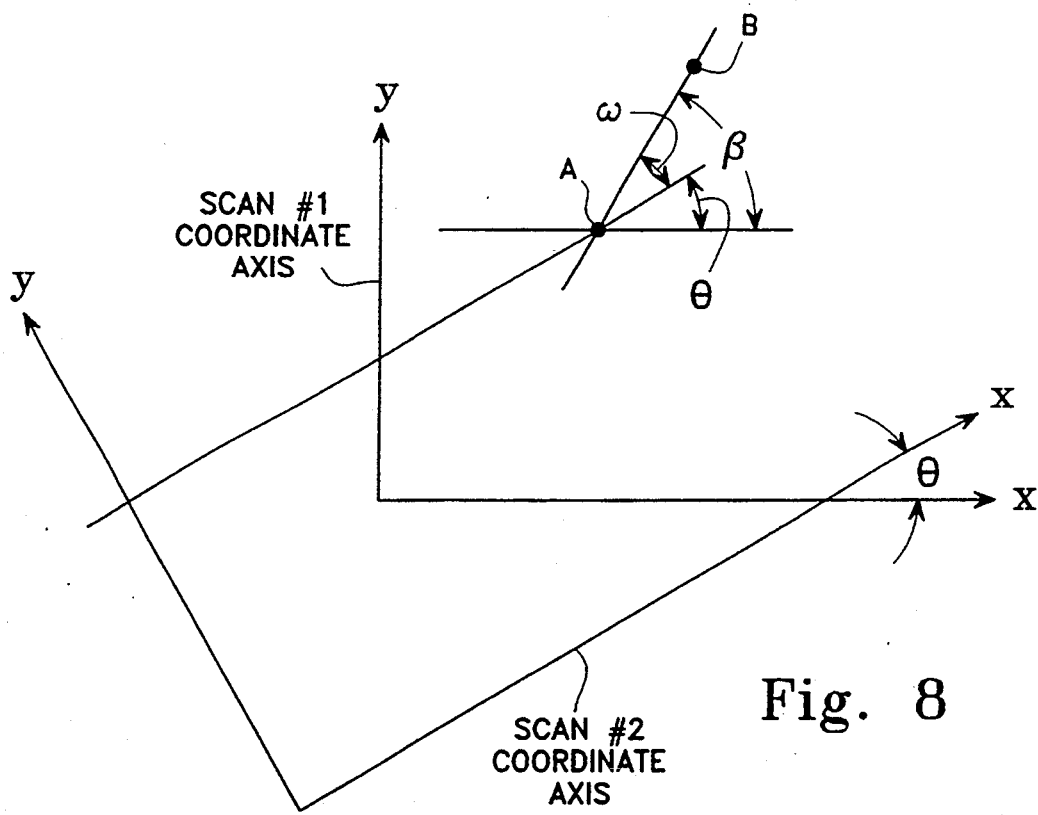
FIG. 8 is a diagram how the angle between the coordinate systems of two scans may be determined.

There are a number of specific methods that could be used to compute the transformation parameters $(dx_i, dy_i, \theta_i)$ from the two sets of measurements of a pair of particles. For purposes of explanation, the method illustrated by FIGS. 8 and 9 will be described. First the angle $\theta$ is computed as shown diagrammatically in FIG. 8, in which the positions of two particles, A and B, are obtained from two separate scans. The angle $\theta$ between the axes of the two scans is computed by determining the angle between the line AB and the Scan1 X axis, and the angle between the line AB and the Scan2 X axis. These angles are indicated in the figure as $\beta$ and $\omega$, respectively. The angles can be computed using an inverse tangent function of the general form $\tan^{-1}[(y_A-y_B)/(x_A-x_B)]$. Then the angle $\theta$ can be found from the difference $\beta-\omega$. Note that this determination can be made even if the line AB has different apparent lengths as observed in the two scans.

Figure 9:
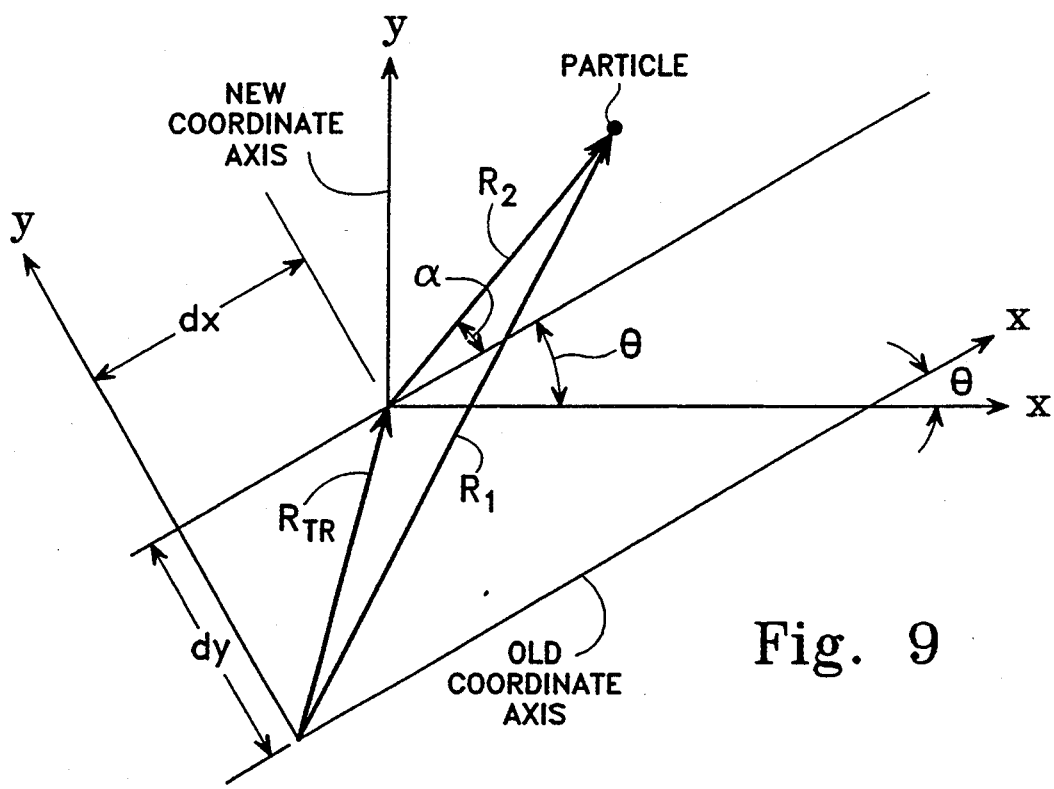
FIG. 9 is a diagram showing how the offset between the coordinate systems of two scans may be determined.

FIG. 9 shows a single particle as observed in two separate scans, of which the coordinate systems differ by a displacement vector $R_{TR}$ (defined by dx and dy), and a rotation angle $\theta$. Values of dx and dy can be computed from the measurements of a single particle, and using the previously calculated value of $\theta$. $R_1$ and $R_2$ are the respective vectors defining the particle position in the two frames of reference, corresponding to the two scans. Basically, the displacement vector $R_{TR}$ is computed by performing the vector subtraction $R_1-R_2$, but the coordinates defining both vectors must be expressed with respect to angularly aligned axes. For example the vector $R_2$ expressed with respect to the "new" scan axes is defined by $x_2''$ and $Y2''$, where these coordinates are measured horizontally and vertically from the particle, as shown in the drawing. These coordinates cannot be arithmetically combined with the $R_1$ coordinates $x_1$ and $y_1$, which are measured with the respect to the "old" coordinate axes. Therefore, the $R_2$ coordinates $x_2'$ and $y_2'$ are first converted to corresponding values $x_2$ and $y_2$, which are parallel with the $x_1$ and $y_1$ coordinates, respectively. The conversion may be accomplished as described below.

First, the angle between $R_2$ and the x axis for the "new" coordinate system is calculated. This is the angle $(\theta+\alpha)$ in FIG. 9, and is given by:

$$(\theta+\alpha)=\tan^{-1}(y_2'/x_2').$$

Then $\alpha$ is found from $(\theta+\alpha)-\theta$. Then $x_2$ and $y_2$ are found from:

$$x_2=|R_2|\cos\alpha,\ y_2=|R_2|\sin\alpha,\ \text{where}\ |R_2|^2=(x_2')^2+(y_2')^2.$$

Finally, dx and dy are computed as:

$$dx=x_1-x_2,\ dy=y_1-y_2.$$

These dx and dy values were computed from the measurements of a single particle in both coordinate systems. Preferably, the same computation is also performed for the other particle of a selected particle pair, and the resulting dx and dy values are averaged with the corresponding values obtained from the first particle of the pair.

From all the computed transformations obtained from pairs of particles, an overall average transformation is computed, by averaging the dx, dy and $\theta$ values, and is designated $(dx_{avg}, dy_{avg}, \theta_{avg})$, where $dx_{avg}=\Sigma dx_i/n$, $dy_{avg}=\Sigma dy_i/n$, and $\theta_{avg}=\Sigma \theta_i/n$, where n is the number of particle pairs analyzed.

4) Remove Outliers: Optionally, transformation data values that deviate widely from the average values may be removed from consideration. The averaged transformation parameters $(dx_{avg}, dy_{avg}, \theta_{avg})$ are compared with the individual transform parameters obtained form each particle pair $(dx_i, dy_i, \theta_i)$. If, for example, $(dx_i>3dx_{avg})$ or $(dy_i>3dy_{avg})$ or $(\theta_i>3\theta_{avg})$, the particle pair is considered an "outlier" and is removed from consideration. After the outliers are removed, the average transformation is repeated, to obtain a revised set of averages $(dx'_{avg}, dy'_{avg}, \theta'_{avg})$, which is considered the "best" set of coordinate transformation parameters between the first and second scans.

5) Transform Scan1 to Scan2: The coordinates of Scan1 are transformed to those of Scan 2, using the transformation parameters $(dx_{avg}, dy_{avg}, \theta_{avg})$, or, if outliers have been removed, using the revised set of averages $(dx'_{avg}, dy'_{avg}, \theta'_{avg})$. The transformed Scan1 is designated Scan1'.

6) Identify Identical Particles: Scan1' is compared with Scan2 to locate matching particles, using the same criteria as in step 2 above. This step provides a set of coordinates for all the matching particles, in terms of the coordinate system of the second scan (Scan2).

7) Average Particle Positions: Corresponding particle positions derived from Scan1' and Scan2 are averaged, to yield an improved set of particle coordinates. This final step averages the x-axis and y-axis coordinates for each particle located in both scans. The coordinates can be averaged because the Scan1 values have been transformed to the same coordinate system as the Scan2 values.

For more than two scans of the wafer, the coordinates of each particle may be obtained by averaging the x-axis and y-axis data from each of the scans. For example, a third scan (Scan3) may produce a set of data values that are first transformed to Scan3' values, consistent with the coordinate system of Scan2, and then all three sets of data may be averaged.

In brief, the multiple scan method of the invention averages the data taken from at least two scans of the wafer, preferably in different orientations, by first transforming the data obtained from all but one of the scans to be consistent with the coordinate system of the other scan; then identifying matching particles in the two scans and averaging the coordinate data for the two scans. As in the two-stage process described in the cross-referenced patent application, the results of the laser scanning stage of the process are used to compute a more accurate coordinate transformation between the laser scanning device and the imaging device. Then the particle coordinates are transformed to the coordinate system of the imaging device, to facilitate location and further analysis of the particles in the imaging device.

The coordinate transformations performed in the multiple scan method and in transforming to the coordinate system of the imaging device, may be completely defined by an offset value and a rotation angle. That is to say, the transformation from one coordinate system to another can be considered to include a linear movement of the x and y axes so that the new origin assumes a position displaced from the old origin, together with a rotation of the axes about the origin to a new angular orientation. Such coordinate transformations are extremely well known, and the simple equations for performing them may be found in almost any basic text on linear algebra, coordinate geometry, or related subject matter. For example, the transformations are completely defined in a text by John J. Craig entitled "Introduction to Robotics: Mechanics and Control," 2nd edition, published by Addison-Wesley Publishing Company, Inc. (1989), and specifically on pages 25-30. The transformation equations may also be found in "Elementary Linear Algebra," by Howard Anton, pp. 229-30, published by Anton Textbooks, Inc. (1987).

It will be appreciated from the foregoing that the present invention represents a significant advance in the field of detection and analysis of contaminant particles in a semiconductor processing environment. In particular, targeting errors are dramatically reduced by using the multiple scan technique of the invention, especially in combination with the techniques disclosed and claimed in the cross-referenced application.

It will also be appreciated that, although an embodiment of the invention has been described in detail for purposes of illustration, various modifications may be made without departing from the spirit and scope of the invention. Therefore, the invention is not to be limited except as by the appended claims.

We claim:

1. A method for reducing errors in locating particles on a semiconductor wafer, the method comprising the steps of:
    (a) scanning a semiconductor wafer in a scanning device to produce a first set of coordinate data values pertaining to the positions and sizes of contaminant particles on the wafer;
    (b) scanning the wafer a second time, to produce a second set of coordinate data values pertaining to the particles on the wafer;
    (c) transforming at least one of the first and second sets of coordinate data values, to produce two consistent sets of coordinate data values based on a common coordinate system, whereby the first and second sets of coordinate data values will not, in general, be identical because of physical uncertainties associated with the scanning steps;
    (d) averaging coordinate data values, from the two consistent sets, pertaining to identical particles, to obtain a more accurate estimate of the positions of the particles on the wafer;
    (e) selecting at least two reference particles that are relatively recognizable because of their size and shape;
    (f) moving the semiconductor wafer to a high-magnification imaging device;
    (g) using the more accurate estimate of the positions of the reference particles, obtained in step (d), to facilitate location of the reference particles in the high-magnification imaging device.

2. A method as defined in claim 1, and further comprising the steps of:
    scanning the wafer at least one additional time, to produce a third set of data coordinate values;
    transforming the third set of data coordinate values to the common coordinate system; and
    averaging the third set of transformed data coordinate values with the two consistent sets, to obtain an even more accurate estimate of the positions of the particles on the wafer.

3. A method as defined in claim 1, and further comprising the step of:
    moving the wafer to a different orientation in the scanning device, between the two scanning steps (a) and (b).

4. A method as defined in claim 1, wherein the step of transforming (c) includes:
    identifying matching particles from the first and second scans;
    computing a coordinate transformation data group for a plurality of pairs of matching particles identified from each scan;
    computing average coordinate transformation parameters from the data groups computed in the prior step; and
    transforming coordinate data for each particle in one of the scans to the coordinate system of the other scan, using the average coordinate transformation parameters.

5. A method as defined in claim 4, and further comprising the following steps performed prior to transforming the coordinate data:
    identifying and removing data groups that depart from the average coordinate transformation by more than a preselected threshold; and
    computing improved average coordinate transformation parameters with the identified data groups removed, for use in the step of transforming the coordinate data.

6. A method as defined in claim 4, wherein:
    the step of identifying matching particles from the first and second scans includes identifying particles whose coordinates from the two scans differ by no more than a selected threshold distance and whose areas differ by no more than a selected threshold.

7. A method for reducing errors in locating particles on a semiconductor wafer, the method comprising the steps of:
   (a) scanning a semiconductor wafer in a scanning device to produce a first set of data coordinate values pertaining to the positions and sizes of contaminant particles on the wafer;
   (b) scanning the wafer a second time, to produce a second set of data coordinate values pertaining to the particles on the wafer, whereby the two sets of coordinate data values will not, in general, be identical because of differences that arise from scanning the wafer in different orientations;
   (c) identifying matching particles from the first and second scans;
   (d) computing a coordinate transformation data group ($dx_i$, $dy_i$, $\theta_i$) for a plurality of pairs of matching particles identified from each scan;
   (e) computing average coordinate transformation parameters ($dx_{avg}$, $dy_{avg}$, $\theta_{avg}$) from the data groups ($dx_i$, $dy_i$, $\theta_i$) computed in step (d);
   (f) transforming coordinate data for each particle in one of the scans to the coordinate system of the other scan, using the average coordinate transformation parameters ($dx_{avg}$, $dy_{avg}$, $\theta_{avg}$);
   (g) averaging corresponding coordinate data values from the transformed set and the other set, to obtain a more accurate estimate of the positions of the particles on the wafer;
   (i) selecting at least two reference particles that are relatively recognizable because of their size and shape;
   (j) moving the semiconductor wafer to a high-magnification imaging device;
   (k) using the more accurate estimate of the positions of the reference particles, obtained in step (g), to facilitate location of the reference particles in the high-magnification imaging device.

8. A method as defined in claim 7, and further comprising the step of:
   moving the wafer to a different orientation in the scanning device between scanning steps (a) and (b).

9. A method as defined in claim 7, and further comprising the following steps performed prior to the transforming step (f):
   identifying and removing data groups that depart from the average coordinate transformation by more than a preselected threshold; and
   computing improved average coordinate transformation parameters ($dx'_{avg}$, $dy'_{avg}$, $\theta'_{avg}$) from the data groups ($dx_i$, $dy_i$, $\theta_i$) with the identified data groups removed;
   wherein the averaging step (g) is performed using the improved coordinate transformation parameters ($dx'_{avg}$, $dy'_{avg}$, $\theta'_{avg}$).

10. A method as defined in claim 7, wherein:
   the step of identifying matching particles from the first and second scans includes identifying particles whose coordinates from the two scans differ by no more than a selected threshold distance and whose areas differ by no more than a selected threshold area.

11. A method for reducing errors in locating particles on a semiconductor wafer, the method comprising the steps of:
   (a) scanning a semiconductor wafer in a scanning device to produce a first set of coordinate data values pertaining to the positions and sizes of contaminant particles on the wafer;
   (b) scanning the wafer a second time, to produce a second set of coordinate data values pertaining to the particles on the wafer;
   (c) transforming at least one of the first and second sets of coordinate data values, to produce two consistent sets of coordinate data values based on a common coordinate system, whereby the first and second sets of coordinate data values will not, in general, be identical because of physical uncertainties associated with the scanning steps;
   (d) averaging coordinate data values, from the two consistent sets, pertaining to identical particles, to obtain a more accurate estimate of the positions of the particles on the wafer;
   (e) selecting at least two reference particles that are relatively recognizable because of their size and contrast;
   (f) obtaining estimated coordinates of the reference particles from the scanning device;
   (g) moving the semiconductor wafer to a high-magnification imaging device and performing an approximate coordinate transformation for the reference particles;
   (h) finding the reference particles in the imaging device and obtaining their corresponding coordinates in the imaging device;
   (i) calculating the parameters for a more accurate coordinate transformation between the coordinate systems of the scanning device and the imaging device, based on multiple unique pairs of the reference particles and their estimated coordinates and actual coordinates; and
   (j) transforming the coordinates of other particles on the wafer from values obtained from the scanning device to estimated values in the coordinate system of the imaging device, to facilitate location and further analysis of the particles in the imaging device.

* * * * *